United States Patent
Cobb et al.

(10) Patent No.: US 7,240,321 B2
(45) Date of Patent: Jul. 3, 2007

(54) SELECTIVE PROMOTION FOR RESOLUTION ENHANCEMENT TECHNIQUES

(76) Inventors: Nicolas B. Cobb, 1632 Willow Lake La., San Jose, CA (US) 95131; Laurence W. Grodd, 3705 SE. Main, Portland, OR (US) 97214; George P. Lippincott, 16711 Gary La., Lake Oswego, OR (US) 97034; Emile Sahouria, 1632 Willow Lake La., San Jose, CA (US) 95131

(*) Notice: Subject to any disclaimer, the term of this patent is extended or adjusted under 35 U.S.C. 154(b) by 433 days.

(21) Appl. No.: 10/730,765

(22) Filed: Dec. 8, 2003

(65) Prior Publication Data

US 2004/0230936 A1  Nov. 18, 2004

Related U.S. Application Data

(63) Continuation of application No. 10/057,309, filed on Jan. 24, 2002, now Pat. No. 6,668,367.

(51) Int. Cl.
  *G06F 17/50* (2006.01)
(52) U.S. Cl. .............................. 716/19; 716/21; 716/11
(58) Field of Classification Search .................. 716/19, 716/11, 21; 707/100
  See application file for complete search history.

(56) References Cited

U.S. PATENT DOCUMENTS

| | | | |
|---|---|---|---|
| 5,432,714 A * | 7/1995 | Chung et al. | 250/492.2 |
| 5,553,273 A * | 9/1996 | Liebmann | 716/21 |
| 5,858,580 A | 1/1999 | Wang et al. | |
| 6,066,180 A * | 5/2000 | Kim et al. | 716/19 |
| 6,453,452 B1 * | 9/2002 | Chang et al. | 716/8 |
| 6,539,521 B1 * | 3/2003 | Pierrat et al. | 716/4 |
| 6,546,532 B1 * | 4/2003 | Kerzman et al. | 716/8 |
| 6,553,562 B2 | 4/2003 | Capodieci et al. | |
| 6,931,613 B2 * | 8/2005 | Kauth et al. | 716/5 |

* cited by examiner

*Primary Examiner*—Don Wong
*Assistant Examiner*—Angela M Lie
(74) *Attorney, Agent, or Firm*—Klarquist Sparkman LLP

(57) ABSTRACT

A tool for optimizing the layout of a microdevice adds fragmentation points to polygons in a first hierarchical database layer in a manner suitable for application of a tool to apply a resolution enhancement technique (RET) such as optical and process correction (OPC). Portions of polygons in a database level that interact with polygons of a second level in the database are promoted to the second database level, and refragmented. The RET operates on the polygons of the first and second levels of the database to determine how polygons of each of the first and second levels should be adjusted, if necessary, such that the layout is optimized.

13 Claims, 8 Drawing Sheets

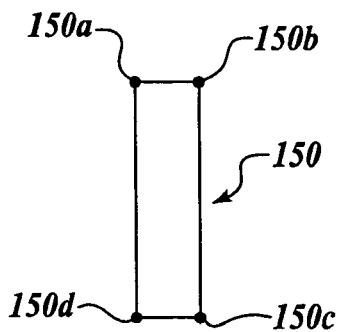
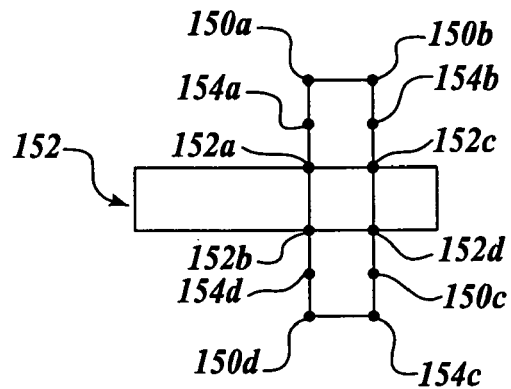
*Fig.9A.*  *Fig.9B.*
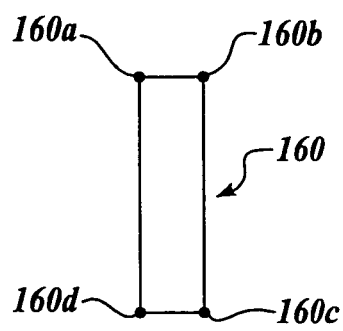
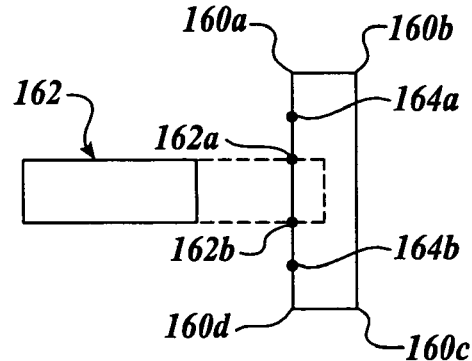
*Fig.9C.*  *Fig.9D.*
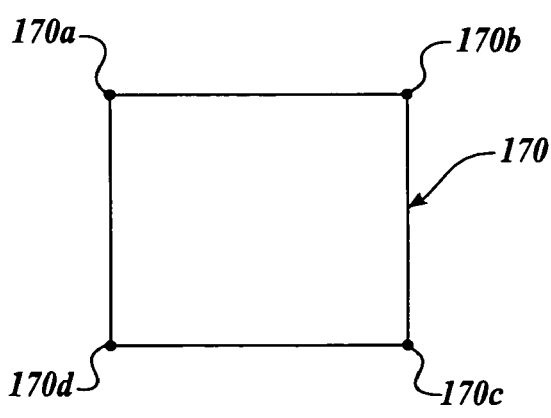
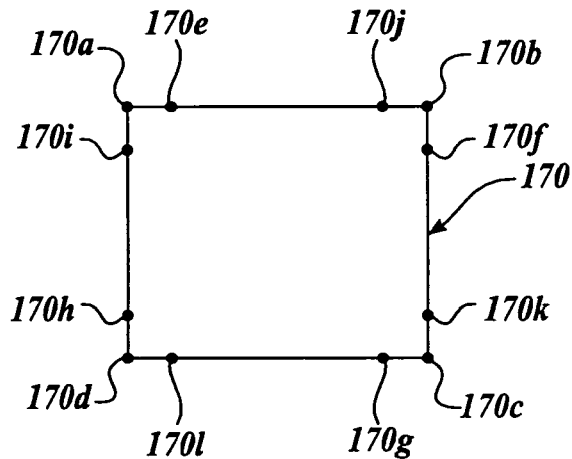
*Fig.9E.*  *Fig.9F.*

SELECTIVE PROMOTION FOR RESOLUTION ENHANCEMENT TECHNIQUES

CROSS-REFERENCE TO RELATED APPLICATION

This application is a continuation of prior application Ser. No. 10/057,309, filed Jan. 24, 2002 now U.S. Pat No. 6,668,367, priority from the filing date of which is hereby claimed under 35 U.S.C. § 120.

FIELD OF THE INVENTION

The present invention relates to systems and methods for management of pattern data for creating microdevices and specifically for data manipulation techniques that prepare microdevice layout data for the application of photolithographic resolution enhancement techniques.

BACKGROUND OF THE INVENTION

In the field of semiconductor manufacturing, physical descriptions of microdevice layouts are generally represented using data formats such as GDSII. In this representation, individual circuit elements are represented by polygons, which are described as a sequence of vertices. For example, FIG. 1 shows a number of polygons 10, 12, 14, 16 while FIG. 2 shows the same polygons represented as a series of vertices. The elements of various physical layers in the device are represented by data layers in the description, and related groups of device elements on various layers can be combined in a description of a subset of the layout, often called a cell. In turn, cells can contain other, smaller cells, or be contained in larger cells, as illustrated in FIG. 3. The organization of cells (each of which can contain data for multiple layers) into a tree structure as shown in FIG. 3A is often called the hierarchy of the device.

It is clear that a hierarchical representation can represent an entire layout with greater compactness than a representation with no hierarchy, also called a flat representation. Products that import layout files for verification such as Calibre™ from Mentor Graphics Corporation, the assignee of the present invention, strive to retain as much of the original hierarchy as possible, and can in some cases reorganize the hierarchy or create additional levels of hierarchy for additional data compactness. An efficient hierarchical database can significantly reduce the size of the file required to describe the microdevice layout.

As the density of objects to be created in a semiconductor wafer increases, new technologies are required to print such objects. In particular, as the size and/or spacing between objects becomes smaller than the wavelength of light used for photolithographic patterning, a variety of optical distortions occur. In order to insure the microdevice is reliably manufactured, several resolution enhancement techniques (RETs) have been developed and are finding increasing adoption. These include: off-axis illumination techniques, such as annular, dipole, and quadrupole illumination; phase-shifting mask techniques, including both attenuated and alternating or Levenson approaches, and OPC (Optical and Process Correction), in which the size and shape of the elements of the layout are corrected to produce an improved image.

To enable the adoption of these resolution enhancement techniques, the layout must be adapted to anticipate the optical effects that the imaging process will introduce. This requires software that will read and analyze the microdevice layout and alter the polygons accordingly. These alterations can take the form of changing sizes and shapes of polygons, moving polygons from one layer to another, creating additional polygons that assist printing fidelity, and even creating additional data layers for representing multiple phase regions on a single reticle or even multiple reticles used for multiple exposure techniques.

In these data manipulations for RET, and especially for those required for OPC, the decision about the necessary action requires an examination of the nearby features. Usually, "nearby" means within a specified "optical radius" that is related to the lithography wavelength, $\lambda$, and numerical aperture, NA, in which optical proximity effects will be significant. However, other definitions that incorporate other effects can be used as well.

Examining nearby features becomes more complex in a hierarchical database, since the nearby features in the layout may be in another cell of the hierarchy. Computations using polygons only within a cell may therefore ignore significant contributions from polygons in neighboring cells. Proper computation of the RET effects and layout manipulations must therefore look across cell boundaries, and up and down in the hierarchy as well.

The problem is most easily solved by flattening the database. With all polygons, and therefore all nearby polygons, on the same level of hierarchy, it is assured that all neighboring interactions will be accounted for. This flattening, however, makes a very large database representation for the microdevice, and destroys the many advantages that hierarchy brings.

To this end, the techniques of selective promotion can be used. In selective promotion for physical verification applications such as Design Rule Checking (DRC), various criteria are used to move only certain interacting polygons from a lower level of hierarchy to a higher one. This allows all the interacting features to be in the same level of hierarchy for computational purposes, while leaving the unrelated features in the lower level of hierarchy. These techniques generally work well, are quite efficient, and have been used extensively in physical verification products such as Calibre®. However, as usually implemented, selective promotion can force polygons that are only partly promoted to be cut. The introduction of these points of scission can be very awkward for many computations used to calculate RET effects.

There is therefore a need for a database management technique, such as selective promotion, that allows for a hierarchical representation of the microdevice, yet also allows accurate and efficient computations of RET effects and the necessary data manipulations.

SUMMARY OF THE INVENTION

The invention presented here provides a method of computing data manipulations required for various RETs, while also allowing a hierarchical representation of the database to be used.

In particular, the invention is a method and apparatus for layout data manipulation that introduces the additional steps of evaluating and adding vertices or fragmentation points to the polygon representations of features in a hierarchical manipulation method such as selective promotion.

The present invention also includes software designed to execute these methods of layout data manipulation, and a stand alone or networked computer system, either single or multi-processing, that executes the method of layout data manipulation. Also encompassed by the invention is a computer readable media or datastream including instructions for executing the method of layout data manipulation.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIGS. 9A–9F illustrate currently preferred techniques for fragmenting polygons for OPC;

DETAILED DESCRIPTION OF THE INVENTION

As indicated above, the present invention is a method and apparatus for selectively promoting polygons in a hierarchical database to facilitate the application of one or more Resolution Enhancement Techniques (RETs), and in particular to facilitate the application of Optical and Process Correction (OPC) techniques.

Figure 1:
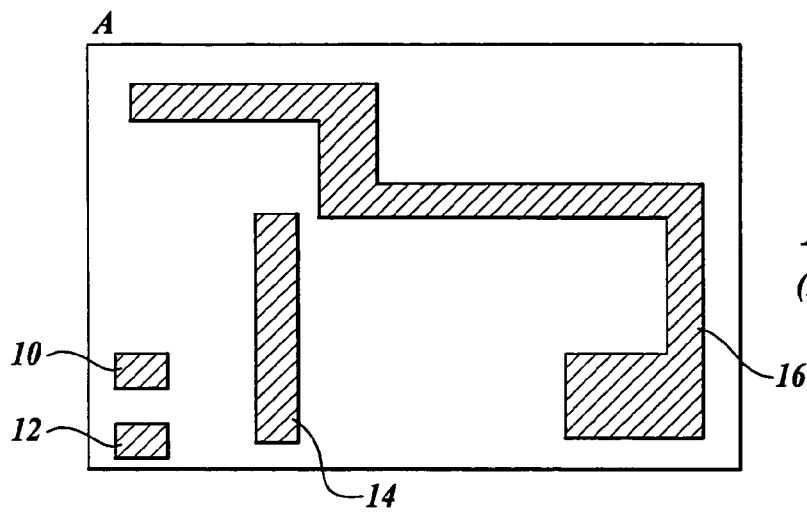
FIG. 1 represents a pattern of polygons in a first level of a hierarchical database.
Figure 2:
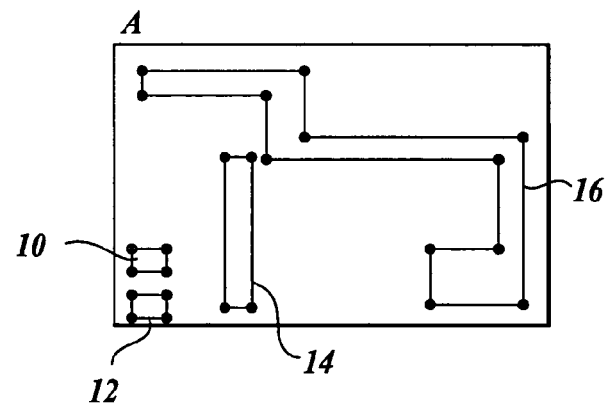
FIG. 2 shows how each of the polygons shown in FIG. 1 is typically represented in a database as a sequence of vertices.

FIG. 1 illustrates a hypothetical portion of a level in a hierarchical database. The database level referred to as level "A", includes a number of polygons 10, 12, 14, 16 that define regions to be exposed (or not exposed) on a semiconductor wafer or other object. Typically, such regions represent circuit elements such as transistors, gates, areas to be doped, interconnect wires, contact pads, etc. The particular polygons shown are for purposes of illustration and are not meant to represent actual circuit elements. As indicated above, in the most common formats, e.g., GDSII, each polygon in the database is described by a number of vertices such as those shown in FIG. 2 that define the perimeter of the polygon. The edges of the polygons between the vertices are generally referred to as edge segments.

Figure 3:
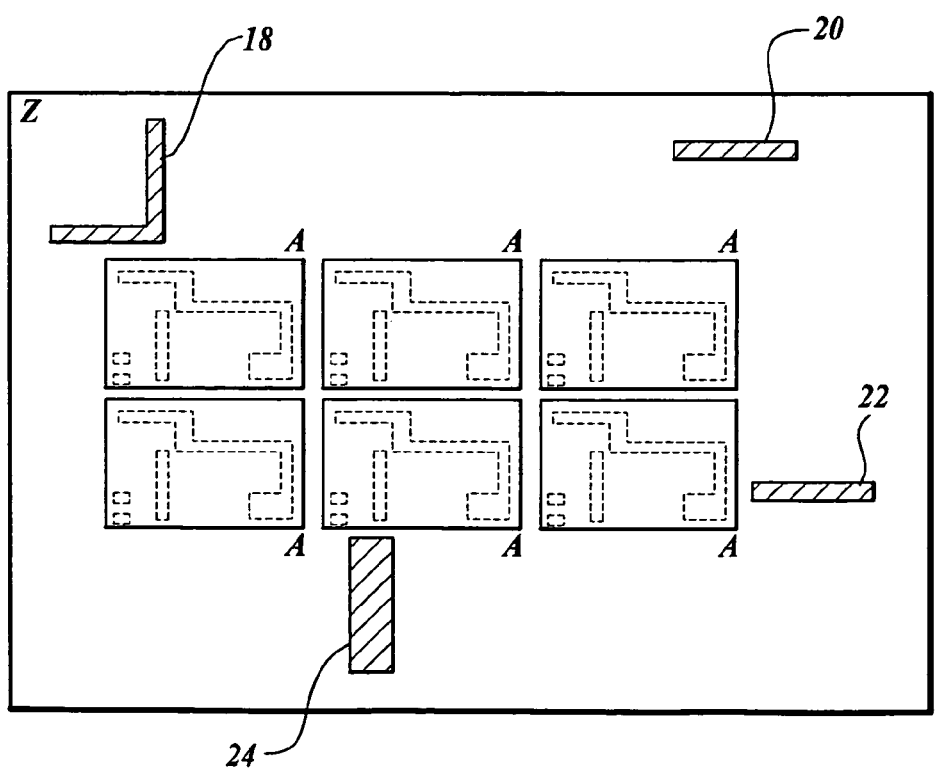
FIG. 3 represents a second level of a hierarchical database including a number of polygons unique to the second level and a number of instances of the pattern of polygons shown in FIG. 1.
Figure 3A:
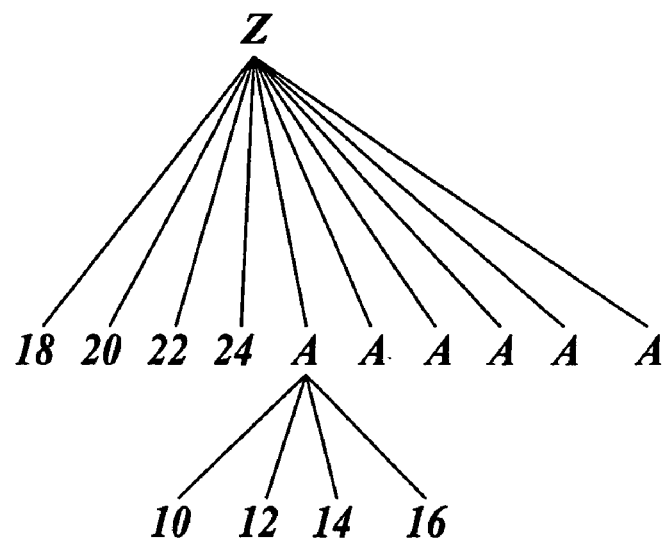
FIG. 3A illustrates the database levels shown in FIGS. 1 and 3 as a hierarchical tree structure.

FIG. 3 illustrates another level "Z" of a hierarchical database that includes a number of polygons 18, 20, 22, 24 that are unique to level Z as well as six instances or placements of the set of polygons defined in level A of the database. FIG. 3A illustrates a hierarchical tree structure for the layout of FIG. 2. The level Z includes individual descriptions of the vertices that define the polygons 18, 20, 22, 24 as well as six references to the placement of the polygons defined in level A of the database. The definition of level A in turn includes descriptions of the vertices that define the polygons 10, 12, 14, and 16. As will be appreciated by those skilled in the art, an actual database that describes a microdevice will generally include many more levels than the two depicted.

By only defining the vertices that make up the polygons in level A once, a data compression can be achieved in level Z. Referring to the repeated pattern of polygons in level A along with an indication where the repeated pattern occurs, it is not necessary to redefine each instance of all the repeated polygons in level Z. Because level Z contains representations of the polygons in level A, level Z is said to be higher than level A in the hierarchy tree. Placements of level A outside of level Z, however, can also occur.

To ensure that the pattern of polygons defined in a hierarchical database level can be accurately formed by photolithography, it is generally necessary to determine if the polygons in a single level, as well as those on different database levels, are within an interaction distance. The interaction distance is typically defined by a parameter called the optical radius R, defined by the first zero of the Airy function, also known as the point spread function, which is dependent on the wavelength $\lambda$, the numerical aperture NA and the imaging illumination conditions. Other criteria, based on any or all of those parameters, $\lambda$, NA and illumination could also be used. Alternatively, a purely geometric factor could be used to define the interaction distance.

Figure 4:
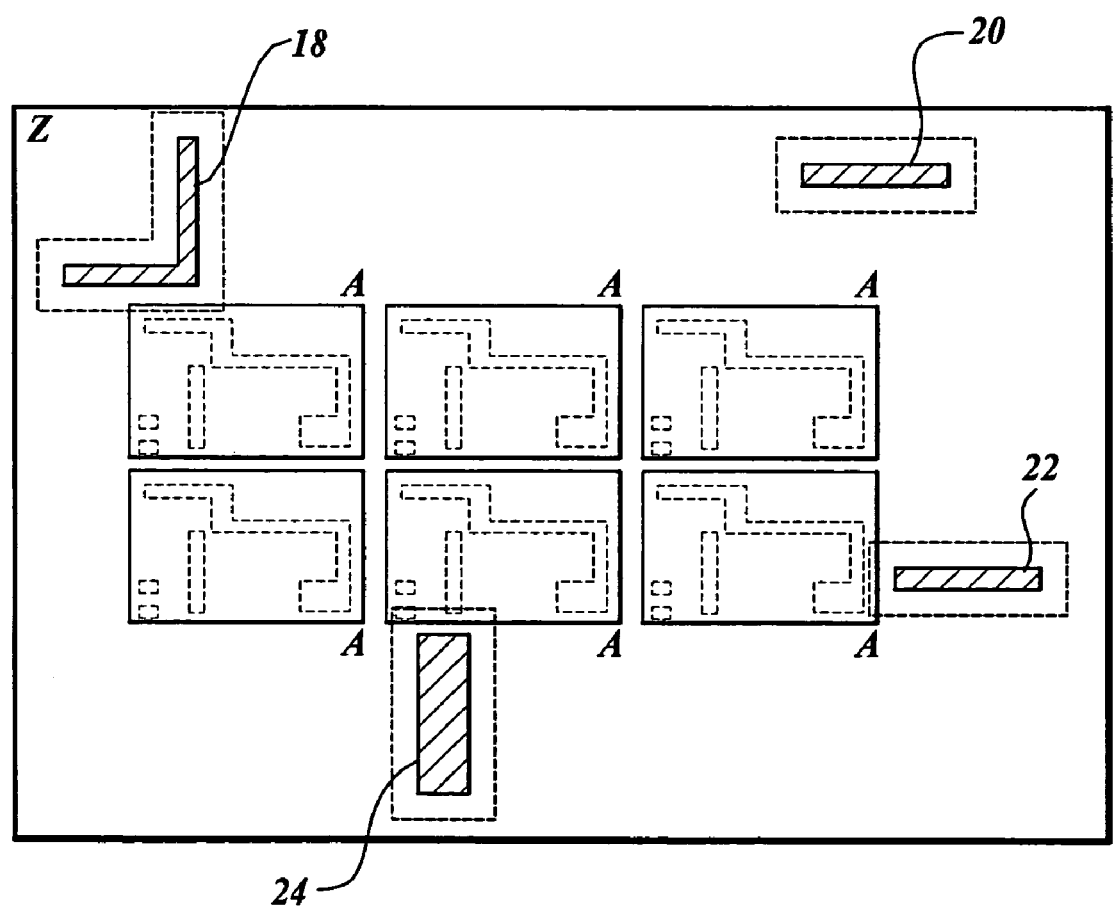
FIG. 4 illustrates how some portions of the polygons defined in the first level of the hierarchical database, as shown in FIG. 1, interact with polygons defined in the second level of the hierarchical database as shown in FIG. 3.

FIG. 4 shows an interaction area around each of the polygons 18–24 defined in the database level Z as indicated by the dotted bounding boxes. In this case, the bounding boxes expand the dimensions of each polygon 18–24 by the optical radius R. Polygons on the same or a different database level that fall within the area of a bounding box may interact with the polygon that is centered in the bounding box. For example, the polygon 20 does not interact with any other polygons in the hierarchical database while the polygons 18, 22 and 24 each fall within the distance of a polygon contained in the database level A.

To ensure that features corresponding to the polygons will be formed accurately on a semiconductor wafer, a tool such as an Optical and Process Correction (OPC) tool is used to analyze the polygons in each level of the hierarchical database. In the example shown in FIG. 4, each of the interacting portions of the polygons (i.e., polygons that are within the interaction distance of another polygon) are defined in different hierarchy levels of the database. To address this, prior selective promotion methods could "promote" or move the interacting portions of the polygons on a lower level to be on the same hierarchical database level as the polygons with which they interact. With the polygons on the same level, an OPC tool can evaluate the interaction and make changes to the position, size or shape of one or more of the polygons if necessary. In conventional selective promotion, the portions of a polygon that interact with those on another level are cut from the original polygon and added as a new polygon in the higher level. However, as indicated above, removing the interacting portions of a polygon and promoting them to another level introduces breaks or new vertices in both the original polygon and in the promoted polygon. These points of scission have been based solely on proximity to the interacting feature, and are not based on any fragmentation algorithm that is optimized for the OPC tool.

Figure 5:
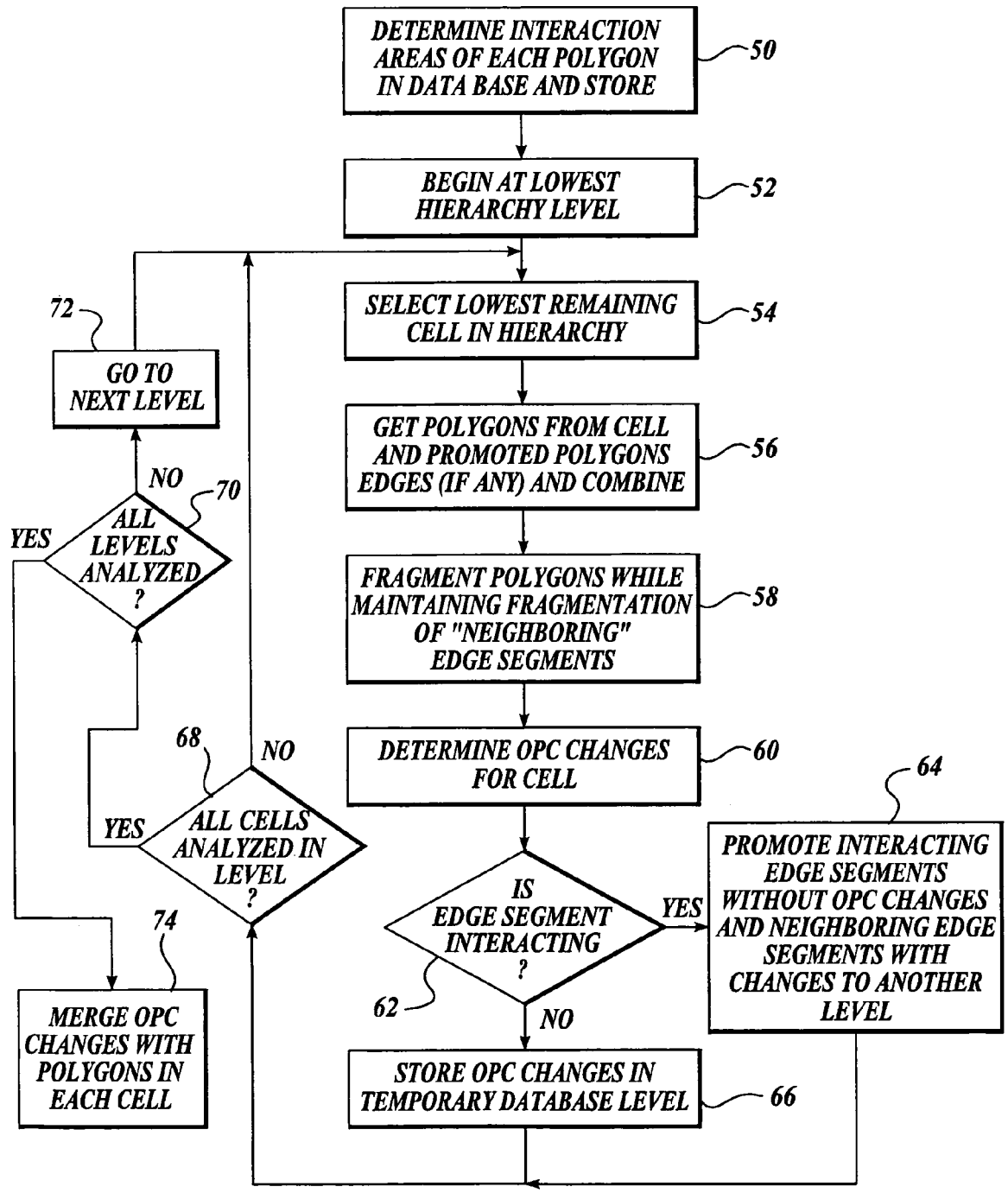
FIG. 5 is a flowchart of a series of acts performed by one embodiment of the invention.

FIG. 5 is a flowchart illustrating a number of acts performed by one embodiment of the present invention for implementing selective promotion for use with a resolution enhancement tool. Although the acts are shown and described in a particular sequence, it will be appreciated that their order may be varied while maintaining the stated functionality. Beginning at a block 50, the interaction region or area for each polygon in the database is determined and stored. In one embodiment of the invention, the interaction is determined by creating a bounding box having dimensions equal to the interaction distance around each polygon. Once the interaction regions of the polygons have been determined, processing begins analyzing the database for the application of the selected resolution enhancement tool beginning with the lowest hierarchical level in the database at a block 52.

At a block 54, the cells in a level are processed beginning with the lowest cell in the hierarchy and working up the hierarchy tree. If two cells are at the same level of hierarchy, either cell can be processed first. Alternatively, other metrics such as coverage area, polygon number, etc., can also be used to select which cell is processed first.

At a block 56, the polygons of a cell are combined with promoted polygons or edge segments, if any.

At a block 58, the polygons and promoted edge segments are fragmented for the application of the resolution enhancement tool. However, the fragmentation for "neighboring" edge segments or edge segments that may interact with an "interacting" edge segment are not refragmented so that the neighboring edge segments will have the same behavior in an upper level of hierarchy as they do in a lower level. The currently preferred techniques for fragmenting polygons when the resolution enhancement tool is an OPC tool are shown in FIGS. 9A–9F and are described in further detail below.

At a block 60, the resolution enhancement tool, which in the example shown is an OPC tool calculates the changes required for each edge segment in the cell to improve its resolution during photolithographic processing.

At a block 62, it is determined whether each edge segment is an "interacting" edge segment, i.e. whether the edge segment is sufficiently close to another edge segment in another level to affect the other edge segment's behavior.

The identification of interacting edge segments that are within an interaction distance of a polygon in a higher database level can be determined by computing a logical AND operation to select those edge segments that are both in a lower level and in the area defined by a bounding box of a polygon in a higher level.

Figure 6:
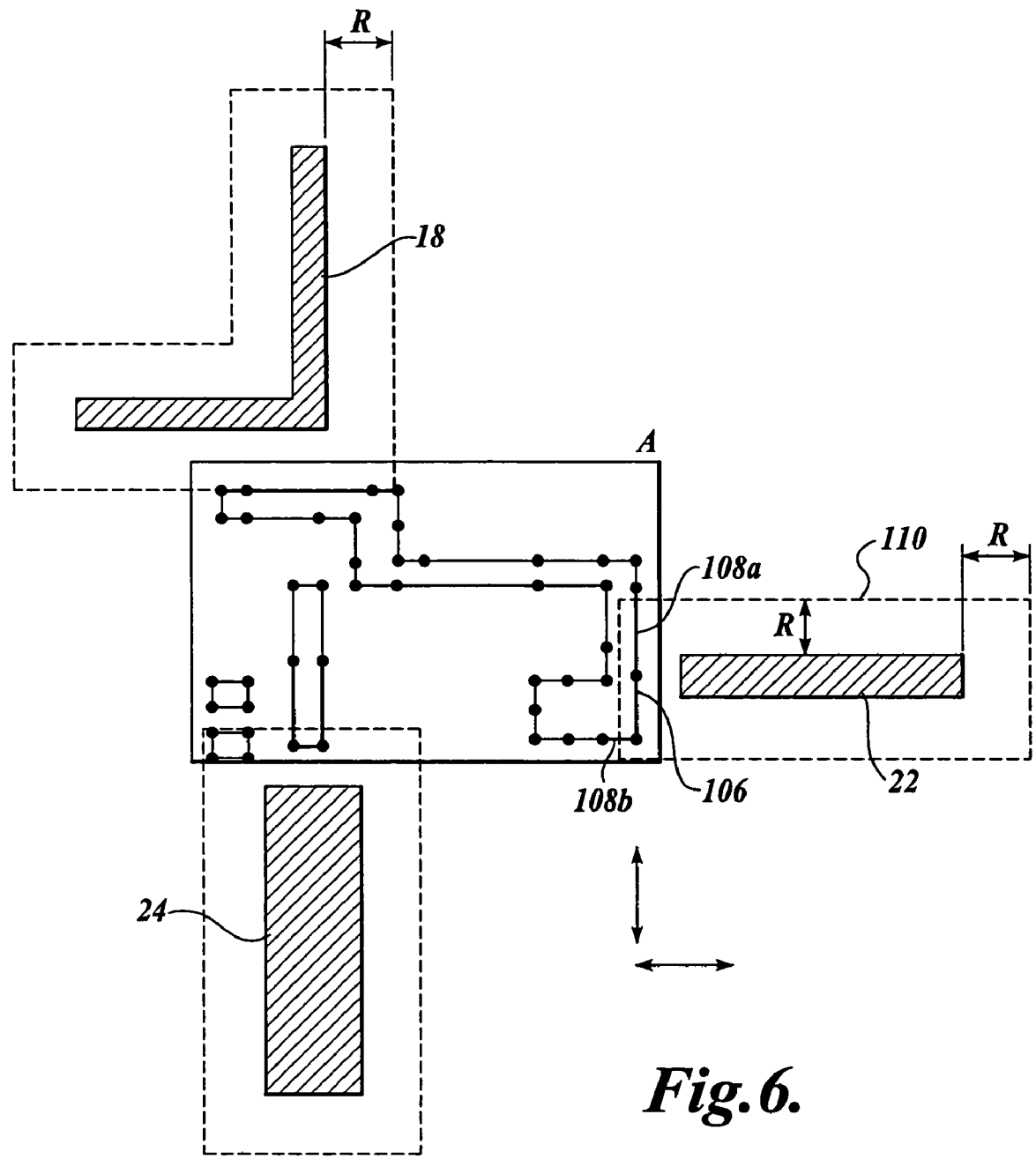
FIG. 6 illustrates how different edge segments of polygons in the first level of the database are within an optical radius of polygons in the second level of the database.

FIG. 6 illustrates an edge segment 106 that is within the area of a bounding box 110 that surrounds the polygon 22. Edge segment 106 can therefore be identified as an "interacting edge segment." FIG. 6 also illustrates an example of a pair of edge segments 108a, 108b that partially overlap a portion of the area of a bounding box 110 that surrounds polygon 22. Edge segments 108a, 108b can also be identified as "interacting edge segments."

At a block 64, those edge segments that are determined to be interacting are promoted to the same level as the polygons with which they interact. In addition, edge segments which are nearby or neighbor the interacting edge segments are promoted along with any changes to the neighboring edge segments as determined by the resolution enhancement tool. However, any changes to the interacting edge segments are preferably not promoted to the higher level since the changes will be recomputed when the cells of the higher level are analyzed.

To promote an edge segment to a higher level, a copy of the edge segment is made in the definition of vertices for the higher level. In addition, in a current embodiment of the invention, each edge segment in the database has a field associated with it to indicate that the edge segment has been promoted to another level or to indicate the level from which the edge segment was promoted. Thus for every edge segment in a cell it is possible to determine if the segment was native to the cell or was promoted into the level. Similarly, it is possible to tell if a segment has remained in a cell or was promoted to another level.

One technique for identifying the edge segments that neighbor an interacting edge segment is to construct a bounding box around the interacting edge segments and to determine what, if any, edge segments fall within these bounding boxes.

Figure 7:
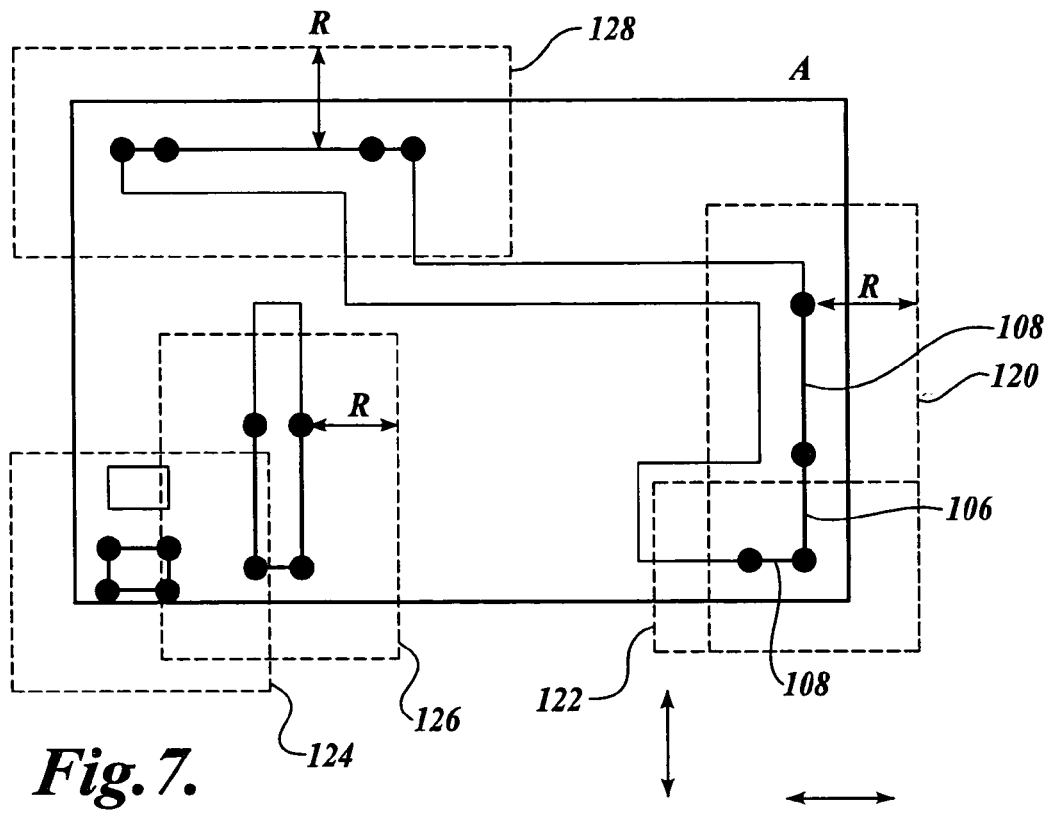
FIG. 7 illustrates bounding boxes created around interacting edge segments in the first level of the hierarchical database.

FIG. 7 illustrates a number of bounding boxes 120–128, wherein each interacting edge segment is surrounded with a new bounding box that extends the length and width of the segment by the interaction distance. In the event that bounding boxes from adjacent segments of the same polygon overlap, the bounding box is preferably expanded to include the maximum area covered by the bounding boxes computed for each individual edge segment. Bounding box 126 is such an example.

Figure 8:
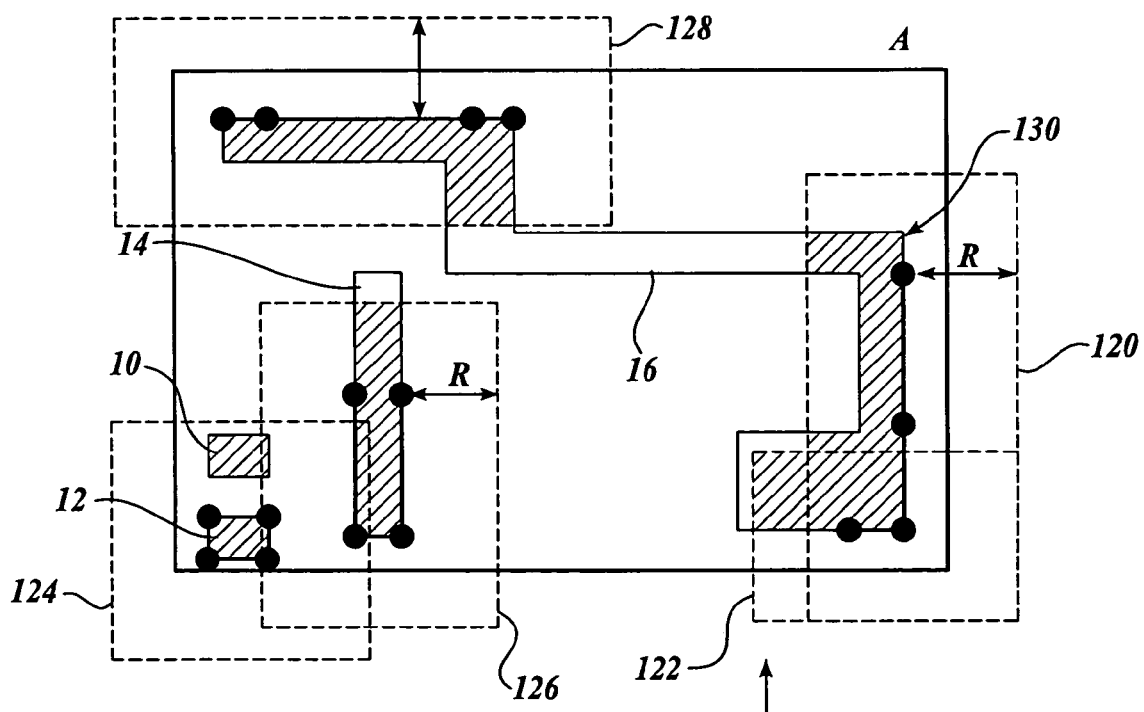
FIG. 8 illustrates the intersection of the bounding boxes shown in FIG. 7 and the polygons within a first level of the hierarchical database.

Next, the polygons defined by the intersection of the new bounding boxes that surround the interacting edge segments and the original polygons contained in the lower database level are copied into the same level of hierarchy as the polygons with which the interacting edge segments interact. The intersection can be determined by computing a logical AND of the new bounding boxes surrounding the interacting edge segments and the original polygons in the lower hierarchy level. FIG. 8 illustrates the intersection of the new bounding boxes placed around the interacting edge segments with the original polygons 10, 12, 14, 16 contained in level A of the database. A polygon 130 represents the intersection of the new bounding boxes 120, 122 with the original polygon 16.

If, at block 62, it was determined that an edge of a polygon was not interacting, then the changes to the edge segments, if any, calculated by the resolution enhancement tool are stored. In one embodiment of the invention, the changes to the edges are stored in a temporary database level.

At a block 68, it is determined if all cells in the database level have been analyzed. If not, processing returns to block 54 and the cell at the next level of hierarchy is analyzed.

If all cells in a level have been analyzed, processing proceeds to block 70 where it is determined if all levels in the database have been analyzed. If not, processing analyzes the next level at block 72 and processing proceeds on the cells in that level as indicated above.

If all levels in the database have been analyzed, processing proceeds to a block 74 wherein the changes to each non-interacting edge segment stored at block 66 are merged with the original polygons of the cells.

As indicated above, the polygons of a cell, including any promoted polygons, are fragmented for OPC by adding additional vertices (and hence additional edge segments). FIGS. 9A–9F illustrate some examples where additional fragmentation is performed. If a polygon in a cell is not within an interaction distance of any other polygon, no additional vertices need to be added. FIG. 9A illustrates an initial polygon 150, defined by vertices 150a–150d. If promotion from a lower level causes another polygon 152 to overlap polygon 150 as shown in FIG. 9B, then new vertice points 152a–152d are defined where the edge segments cross. In addition, new vertices 154a–154d are created just outside of the crossing points.

If two polygons in a layer are within an interacting distance but not overlapping, new vertex points are defined where the projection of one polygon overlaps the other. For example, FIG. 9C shows a polygon 160 defined by vertices 160a–160d A new polygon 162 is promoted close to, but not overlapping with polygon 160. Even though they do not overlap, polygon 162 is within an interaction distance of the polygon 160. The projection of the closest edge of the polygon 162 onto the polygon 160 defines where two new vertices 162a, 162b are added to the polygon 160. Additional vertices 164a, 164b may be created on the polygon 160 just outside of the new vertices 162a, 162b.

FIG. 9E illustrates polygon 170 defined by four vertices 170a–170d. Fragmentation is performed by adding additional vertices 170e–170j around each corner vertex.

Fragmentation generally involves the addition of new vertices between the vertices that define the end points of an edge segment. The end points are generally not changed.

As will be appreciated, each time a new vertex is defined, a new edge segment is therefore created. The definitions of the edge segments in the database are updated to reflect the new edge segments. For layouts that include many levels of hierarchy in the database, processing speed can be improved using parallel processing techniques where more than one processor is used. Each processor can analyze a different cell or level of hierarchy providing that before a particular level is analyzed, any lower levels that are referenced in the level being analyzed are completed first. Topological sorts can be used to ensure processing takes place in the correct order.

Figure 10:
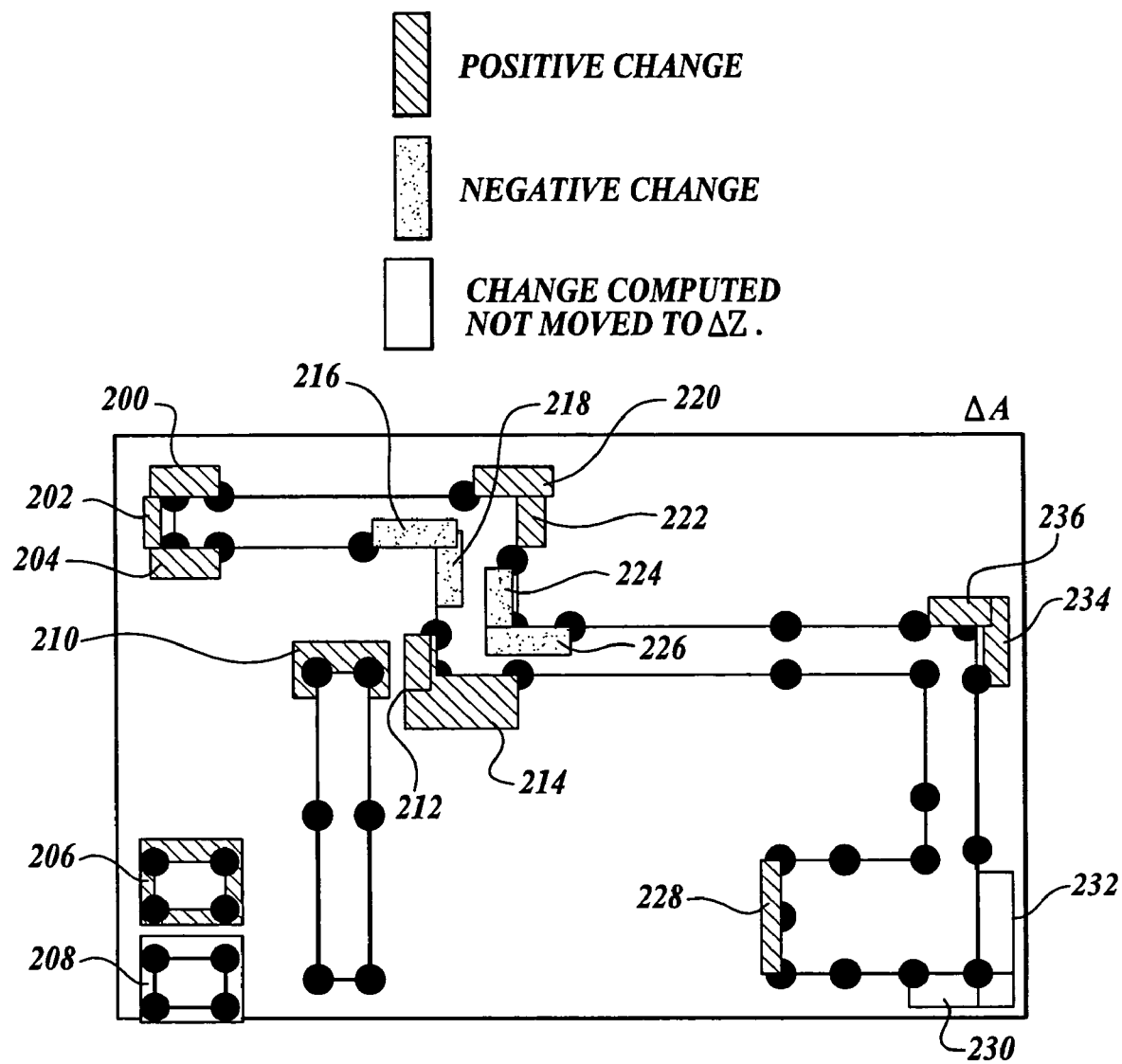
FIG. 10 illustrates changes made to edge segments in the first level of the hierarchical database after an analysis by a resolution enhancement tool.

As indicated above, in one embodiment of the invention, the polygons representing non-interacting edge segment motions are stored in an additional or "dummy" level in the hierarchical database. FIG. 10 illustrates a number of polygons 200–236 that represent edge segment movements of the polygons in a corresponding level. As indicated, it is currently preferred that only the polygons computed for non-promoted edge segments be stored. In the example shown, only polygons 210, 212, 214 and 228 would be stored in a dummy level because these edge segments were not promoted to another level in the hierarchy. However, it will be appreciated that instead of creating a dummy database level, the changes represented by the polygons representing edge segment movements could be directly written to the database that defines the polygons in that hierarchy level.

As will be appreciated by those skilled in the art, if changes to a polygon are to appear when printed, they cannot be obscured by another polygon defined for the same physical place on the layout but in another level of the hierarchy. For example, if the motion to an edge segment makes a polygon larger in a level, the motion can be merged with the original polygons. If, however, there are negative motions such that an original polygon is made smaller, it must be determined if there is a copy of that portion of the original polygon that was promoted to another level. If there is a copy of the polygon, the copy must also be changed to have the smaller dimension or it will overwrite the change made to the original polygon. Therefore, when a negative change is made to an edge segment of a polygon, all hierarchy levels should be checked to make sure there are no polygons defined in another level of the database that would overwrite the change.

Although the present embodiment of the invention applies the resolution enhancement tool to each edge segment in the level, it will be appreciated that the processing speed could be increased for a level by not analyzing those edge segments that were promoted to another hierarchy level.

Figure 11:
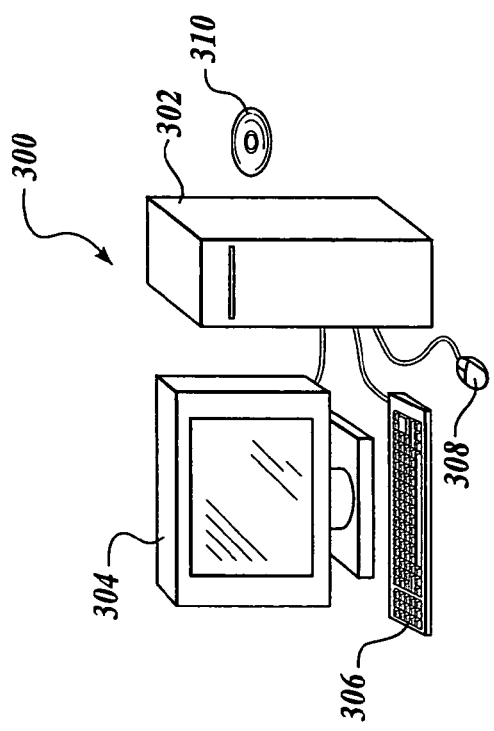
FIGS. 11 and 12 illustrate two example computing systems that can be used to implement the present invention.
Figure 12:
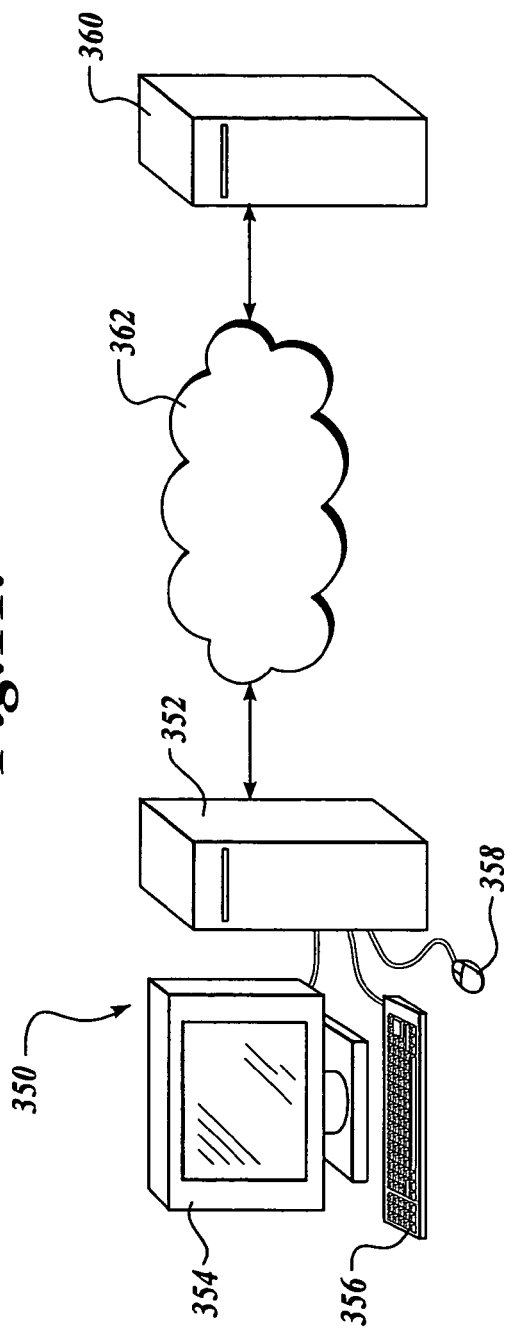

FIGS. 11 and 12 illustrate two possible computer systems on which the present invention can be implemented. FIG. 12 shows a stand alone computer system 300 including a conventional single or multiprocessor computer 302, monitor 304, keyboard 306 and pointing device such as a mouse. The computer system 300 is programmed to receive a computer-readable medium such as a magnetic or optically read disk 310 having stored thereon a sequence of program instructions that, when read and loaded into memory for execution by the computer system, cause the computer system to selectively promote polygons in a hierarchical database and execute an OPC tool on the refragmented database as described above.

FIG. 12 shows a networked computer system whereby a computer system 350 is connected to a server or mainframe computer 360 through a computer network 362, which may be a local area network, wide area network or global computer network such as the Internet. Instructions to perform the selective promotion and application of an OPC tool are downloaded from the server or mainframe computer 320 to the computer system 300 as a sequence of digital packets or other formatted data to cause the computer system 350 to implement the method described above. Alternatively, the instructions may be transmitted as a time varying wired or wireless carrier wave or other communication mechanism for transmitting the computer instructions from the server or mainframe computer 360 to the local computer 350.

While the preferred embodiment of the invention has been illustrated and described, it will be appreciated that various changes can be made therein without departing from the scope of the invention. It is therefore intended that the scope of the invention be determined from the following claims and equivalents thereof.

The embodiments of the invention in which an exclusive property or privilege is claimed are defined as follows:

1. A method of preparing data that describes the layout of a microdevice to be created by a photolithographic process for the application of a resolution enhancement technique, comprising the acts of:

reading a microdevice layout that is stored in a hierarchical database having a number of levels, each level including definitions of polygons corresponding to features in the microdevice, each polygon being defined as a number of vertices;

analyzing interacting polygons in the database;

promoting polygons or portions thereof such that polygons that interact are defined on the same hierarchical level of the database;

fragmenting the polygons in a level of the database containing any promoted polygons so that the vertices that define each polygon are optimized for the application of the resolution enhancement techniques (RET).

2. The method of claim 1, additionally comprising: fragmenting a portion of the layout for the application of an RET prior to the step of analyzing the interacting polygons.

3. The method of claim 1, wherein the act of promoting polygons includes:

defining a copy of a polygon or portion thereof in another database level containing an interacting polygon without altering the fragmentation of the polygons in the level from which the promotions are made.

4. The method of claim 1, in which the promoted portions of polygons are edge segments.

5. The method of claim 4, further comprising:

keeping a record of which edge segments in a database level have had copies promoted to another hierarchy level.

6. The method of claim 4, further comprising:

keeping a record of which edge segments in a database level have been promoted from another hierarchy level.

7. A method of preparing data for the application of an optical and process correction (OPC) tool to a layout stored in a hierarchical database that defines a microdevice to be manufactured lithographically, comprising the acts of:

fragmenting polygons in the levels of the hierarchical database so that each polygon is optimized for the application of the OPC tool;

selectively promoting interacting polygons or portions thereof such that interacting polygons are defined on the same database level, wherein said selective promotion does not affect fragmentation of the polygons or portions thereof that are promoted; and refragmenting the polygons and any promoted polygons or portions thereof for the application of the OPC tool.

8. The method of claim 7, in which the promoted portions of polygons are edge segments.

9. A method of preparing data stored within a hierarchical database prior to performing optical and process correction (OPC) on the data, wherein the data defines a number of polygons that describe a microdevice to be manufactured lithographically, comprising:

selectively promoting copies of polygons or portions thereof in the database such that interacting polygons or portions thereof are defined in the same database level; and fragmenting polygons defined in a level of the hierarchical database including any promoted polygons or portions thereof for the application of an OPC tool.

10. The method of claim 9, in which the promoted portions of polygons are edge segments.

11. A computer readable medium containing a sequence of instructions that are executable by a computer system to perform a method of preparing data that describes the layout of a microdevice to be created by a photolithographic process for the application of a resolution enhancement technique, by performing the acts of:

reading a microdevice layout that is stored in a hierarchical database having a number of levels, each level including definitions of polygons corresponding to features in the microdevice, each polygon being defined as a number of vertices;

analyzing interacting polygons in the database;

promoting polygons or portions thereof such that polygons that interact are defined on the same hierarchical level of the database; and fragmenting the polygons in a level of the database containing any promoted polygons so that the vertices that define each polygon are optimized for the application of the resolution enhancement technique.

12. A computer readable medium containing a sequence of instructions that are executable by a computer system to perform a method of preparing data for the application of an optical and process correction (OPC) tool to a layout stored in a hierarchical database that defines a microdevice to be manufactured lithographically, comprising the acts of:

fragmenting polygons in the levels of the hierarchical database so that each polygon is optimized for the application of the OPC tool;

selectively promoting interacting polygons or portions thereof such that interacting polygons are defined on the same database level, wherein said selective promotion does not affect fragmentation of the polygons or portions thereof that are promoted; and refragmenting the polygons and any promoted polygons or portions thereof for the application of the OPC tool.

13. A computer readable medium containing a sequence of instructions that are executable by a computer system to perform a method of preparing data that is stored within a hierarchical database that defines a number of polygons describing a microdevice to be manufactured lithographically prior to using an optical and process correction (OPC) tool on the data by:

selectively promoting copies of polygons or portions thereof in the database such that interacting polygons or portions thereof are defined in the same database level; and fragmenting polygons defined in a level of the hierarchical database including any promoted polygons or portions thereof for the application of the OPC tool.

* * * * *